US007724524B1

(12) United States Patent
Campbell et al.

(10) Patent No.: US 7,724,524 B1
(45) Date of Patent: May 25, 2010

(54) HYBRID IMMERSION COOLED SERVER WITH INTEGRAL SPOT AND BATH COOLING

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 12/269,156

(22) Filed: Nov. 12, 2008

(51) Int. Cl.
*H05K 7/20* (2006.01)

(52) U.S. Cl. .................. 361/701; 361/679.53; 361/699; 165/80.4; 165/80.5; 165/104.19

(58) Field of Classification Search ............ 361/679.46, 361/679.47, 679.53, 698–702, 724–729; 165/80.2, 80.3, 80.4, 80.5, 104.19, 104.22, 165/185; 257/712–714, E23.1, E23.088; 174/15.1, 16.3, 17 VA, 252; 62/259.2
See application file for complete search history.

(56) References Cited

U.S. PATENT DOCUMENTS

| | | | | |
|---|---|---|---|---|
| 4,590,538 A | * | 5/1986 | Cray, Jr. ..................... 361/700 |
| 5,907,473 A | * | 5/1999 | Przilas et al. ................ 361/699 |
| 5,963,425 A | | 10/1999 | Chrysler et al. |
| 6,304,447 B1 | * | 10/2001 | Bortolini et al. ............. 361/699 |
| 6,938,678 B1 | * | 9/2005 | Bortolini et al. ............ 165/80.4 |
| 7,254,024 B2 | * | 8/2007 | Salmon ....................... 361/699 |
| 7,285,851 B1 | * | 10/2007 | Cepeda-Rizo et al. ........ 257/712 |
| 7,318,322 B2 | * | 1/2008 | Ota et al. .................... 62/259.2 |
| 7,342,789 B2 | * | 3/2008 | Hall et al. .................... 361/701 |
| 7,355,852 B2 | * | 4/2008 | Pfahnl ......................... 361/699 |
| 7,380,409 B2 | | 6/2008 | Campbell et al. |
| 7,403,392 B2 | * | 7/2008 | Attlesey et al. ............. 361/699 |
| 7,414,845 B2 | * | 8/2008 | Attlesey et al. ............. 361/699 |
| 7,486,513 B2 | * | 2/2009 | Hall et al. ................... 361/699 |
| 7,551,440 B2 | * | 6/2009 | Belady et al. ............... 361/699 |
| 7,602,609 B2 | * | 10/2009 | Spearing et al. ............. 361/701 |
| 2004/0057211 A1 | * | 3/2004 | Kondo et al. ................ 361/696 |

(Continued)

OTHER PUBLICATIONS

Campbell et al., "Liquid-Based Cooling Apparatus for an Electronics Rack", U.S. Appl. No. 11/763,678, filed Jun. 15, 2007.

(Continued)

*Primary Examiner*—Michael V Datskovskiy
(74) *Attorney, Agent, or Firm*—Geraldine D. Monteleone; Lily Neff

(57) ABSTRACT

A hybrid immersion cooling apparatus and method is provided for cooling of electronic components housed in a computing environment. The components are divided into primary and secondary heat generating components and are housed in a liquid sealed enclosure. The primary heat generating components are cooled by indirect liquid cooling provided by at least one cold plate having fins. The cold plate is coupled to a first coolant conduit that circulates a first coolant in the enclosure and supplies the cold plate. Immersion cooling is provided for secondary heat generating components through a second coolant that will be disposed inside the enclosure such as to partially submerge the cold plate and the first coolant conduit as well as the heat generating components.

20 Claims, 4 Drawing Sheets

U.S. PATENT DOCUMENTS

2007/0201210 A1    8/2007   Chow et al.
2008/0123297 A1*   5/2008   Tilton et al. ................. 361/700
2009/0260777 A1*  10/2009   Attlesey ...................... 165/67

OTHER PUBLICATIONS

Iyengar et al., "Apparatus and Method for Facilitating Cooling of an Electronics System", U.S. Appl. No. 11/957,619, filed Dec. 17, 2007.

Goettert et al., "Heat Exchange System for Blade Server Systems and Method", U.S. Appl. No. 12/038,025, filed Feb. 27, 2008.

Chu et al., "Energy Efficient Apparatus and Method for Cooling and Electronics Rack", U.S. Appl. No. 12/108,020, filed Apr. 23, 2008.

Campbell et al., "Suspended Integrated Manifold System with Serviceability for Large Planar Arrays of Electronic Modules", IBM Technical Disclosure, IP.com, IP.com No. IPCOM000126455D (Jul. 18, 2005).

Chee, B., "Supermicro Water Cooled Blades", Info World, Geeks in Paradise, (Mar. 5, 2008), http://weblog.infoworld.com/geeks/archives/2008/03.

Campbell et al., "Liquid Cooling Apparatus and Method of Facilitating Cooling of an Electronic System", U.S. Appl. No. 12/168,259, filed Jul. 7, 2008.

* cited by examiner

HYBRID IMMERSION COOLED SERVER WITH INTEGRAL SPOT AND BATH COOLING

BACKGROUND OF THE INVENTION

1. Field of the Invention

This invention relates to cooling of computing systems environments and more particularly large computing systems environments that include one or more servers.

2. Description of Background

The industry trend has been to continuously increase the number of electronic components inside computing systems. Given the limited footprint of many computing systems, a continuous increase in the number of heat generating components creates challenging heat dissipation issues. These issues if not dealt with adequately can harm the structural and data integrity of the computer system, making the effect felt both at a system and module level.

Most electronic packages or nodes in large environments are housed in stacks disposed in frames that resemble racks or cages. Traditionally, these electronic packages have been cooled by forced air cooling using air moving devices, such as fans and blowers, selectively disposed somewhere in the environment as to allow optimum air flow. These air moving devices are often designed to displace hot air away from the components by creating parallel air flow paths that circulate through the rack or cage like frame or structure.

As the packaging densities increase, however, the air cooling solutions are becoming more prohibitive and costly. In addition, air cooling has other associated costs in the form of unwanted acoustic and energy consumption characteristics. In large data centers that house many computing environments in close proximity, the heat dissipation issue is exacerbated even more. In such cases, cooling costs and feasibility of providing air cooling have become a burden to many businesses that rely on their data centers.

In recent years, direct or indirect liquid cooling has become a more attractive option for the designers of computing systems. Immersion or direct liquid cooling has been shown to be substantially less burdensome both in terms of energy costs and resource allocations, especially for use in data centers. The prior art currently being practiced, however, whether air cooled or water cooled is limited in its offerings. It is a concern that current methods being used cannot adequately provide for future generation designs. Consequently, a solution is needed to make the server environment quieter and more energy efficient while providing heat dissipation solutions that can extend beyond current systems designs and can be practically applicable in fabrication of future generation environments.

SUMMARY OF THE INVENTION

The shortcomings of the prior art are overcome and additional advantages are provided through the provision of a method and associated hybrid immersion cooling apparatus for cooling of electronic components housed in a computing environment. The components are categorized as primary and secondary heat generating components and are housed in a liquid tight enclosure. The primary heat generating components are cooled by indirect liquid cooling provided by at least one cold plate having fins. The cold plate is coupled to a first coolant conduit that circulates a first coolant in the enclosure and supplies the cold plate. Immersion or direct liquid cooling is provided for secondary heat generating components through a second coolant that will be disposed inside the enclosure such as to partially submerge the cold plate and the first coolant conduit as well as the heat generating components.

In one embodiment, the cold plate and the coolant conduit each comprise extended external surfaces used to transfer heat from the second coolant to the first coolant.

In one embodiment the second coolant cools the electronics via free convection or a combination of free convection and boiling while an alternate embodiment provides a submerged pump to aid circulation. In yet another embodiment, the electronics are housed on an electronics board that is tilted at an angle to also aid circulation of the second coolant.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

Figure 1:
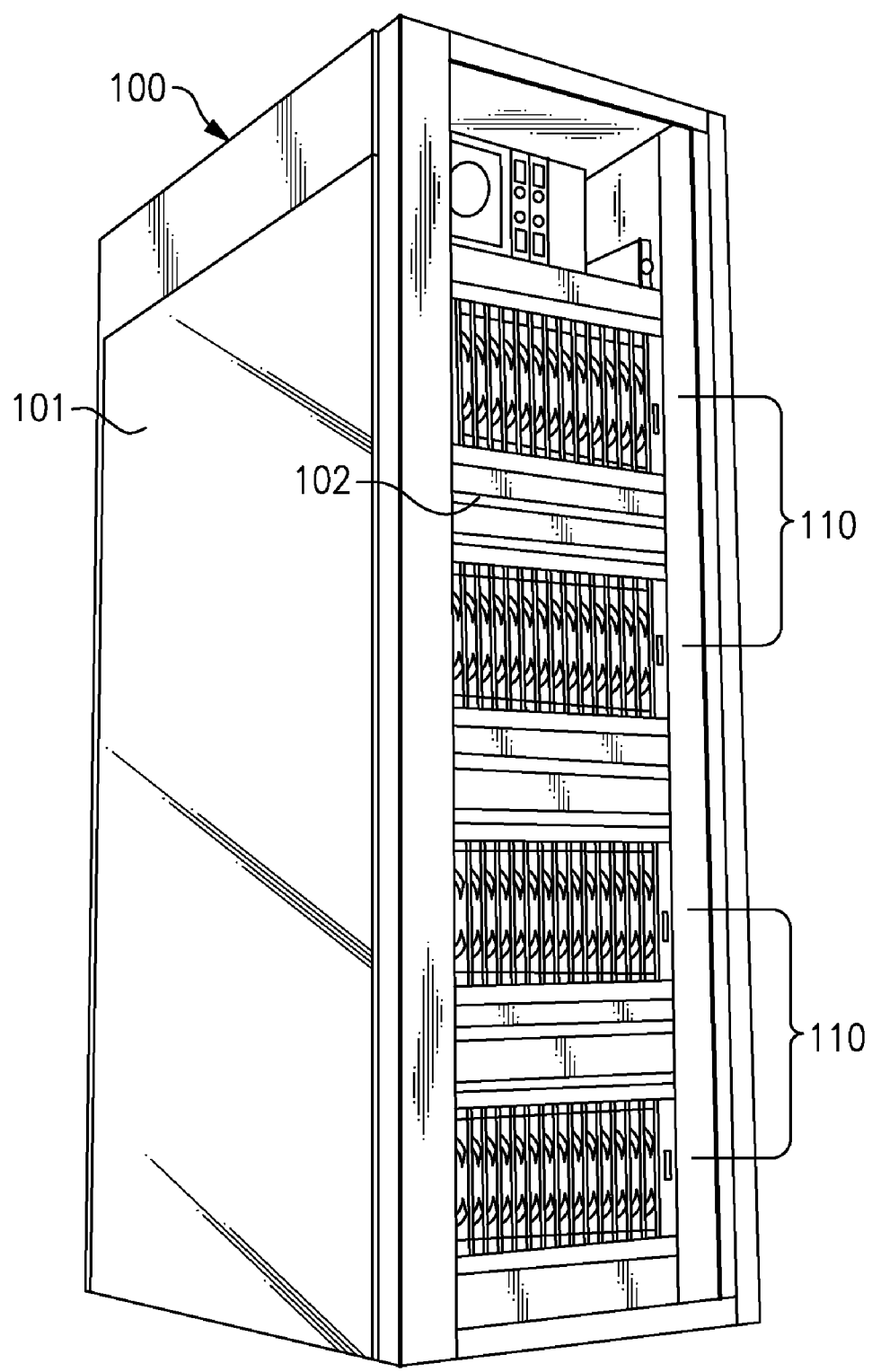
FIG. 1 is a perspective view illustration of a computer housing having a rack frame.

FIG. 1 is a perspective view illustration of a computer environment comprising of a housing 100, having a frame 102, preferably with a rack or cage like structure as shown. The housing 100 can also incorporate full or partial doors or covers such as referenced by numerals 101.

It should be noted that as used herein, the term computer or electronic rack 102, hereinafter will be used for ease of reference but can be construed to include any housing, frame, rack, compartment, blade server system or other structural arrangements including any that may incorporate doors and/or covers. In addition, the computer rack 102 can be either a stand alone computer processor or a sophisticated system, having high, mid or low end processing capability.

In one embodiment, an electronics rack may comprise multiple electronic system chassis, each having one or more heat generating electronics systems disposed therein requiring cooling. In different embodiments, an electronic system chassis may be a multi-blade center system 110 with each blade being removable and stackable inside the rack 102. In one example, one or more blades of a multi-blade center
} system are immersion cooled blades. "Immersion cooled electronic system" or "immersion cooled blade" refers to any system, blade, book, node or other similar notions as known to those skilled in the art, having multiple different types of electronic components thereof directly cooled by common immersion within coolant flowing around, over, through or across the electronic components. In one instance, one or more surfaces of each electronic component of the multiple different types of electronic components are in direct physical contact with the coolant to facilitate transfer of heat from the electronic component to the coolant.

Referring back to FIG. 1, in this example, the electronic rack 102 comprises a stack of electronic system chassis or multi-blade center systems 110, as well as supporting power supplies, networking equipment and other similar and necessary components, not individually illustrated.

Figure 2A:
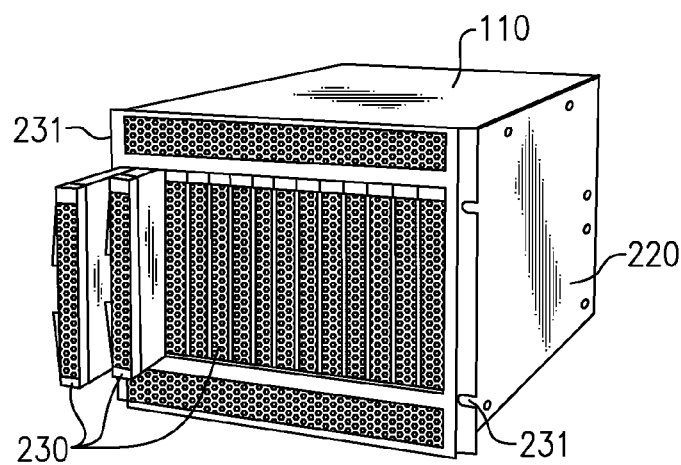
FIGS. 2A and 2B provide perspective views of computing environment using removable subsystems and nodes such as blades systems.
Figure 2B:
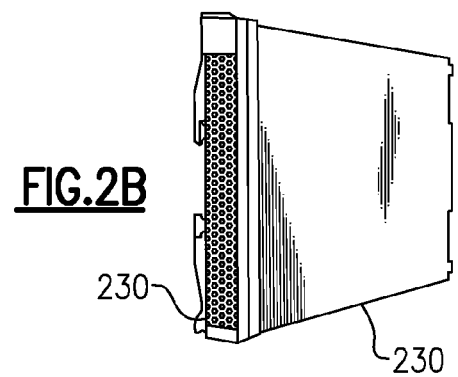

FIG. 2A, provides a perspective view of a multi-node or multi-blade center 110, such as shown in FIG. 1, one example of which is marketed by International Business Machines Corporation, of Armonk, N.Y. By way of specific example, multi-blade system 110 may comprise a stand alone server system which incorporates scalable computing functionality up to, for example, fourteen high performance blades. In some embodiments the system can include multiple removable nodes or blades 230 and system chassis 220. As one example, each removable blade 230 is an electronics system, such as a server of a multi-server electronics system. Flanges 231 are also provided that can be used to secure the blade system within an electronics rack. FIG. 2B provides a perspective view of one such removable blade 230.

Figure 3:
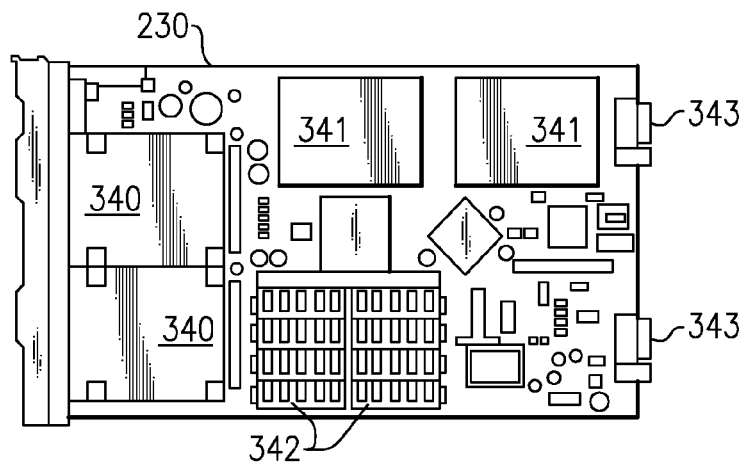
FIG. 3 is a schematic illustration of electronic components disposed on a printed circuit board.

FIG. 3 is a schematic illustration of a package with electronic components, such as the blade system 230 discussed in conjunction with FIGS. 2A and 2B. In this figure each package or blade can include multiple processors and can be a complete computer system having systems and/or subsystems that can include Direct Access Storage Devices (DASDs) 341 and Dual In-Line Memory Modules (DIMMs) 342. Corresponding electrical connectors 343 can be provided connecting these blades 230 to respective electronic system chassis 220. These connectors are typically disposed near the back of the chassis for making electrical connection to connectors when the blade is inserted into the chassis in operational position. In some embodiments, cooling units such as heat sinks 340 can also be disposed within each removable blade 230 for cooling high flux components such as processor modules.

In prior art, air cooled components such as the DIMMs and DASDs shown in FIG. 3, were becoming so closely packed and so numerous that air cooling systems were becoming cost prohibitive. As a result, little improvement margin—was left for future designs. To make matters worse, the prohibitively high air flow rates had an associated acoustic and energy consumption characteristic that were unattractive for many of the customers. The present invention provides a liquid cooling solution that makes the servers quieter, more energy efficient and can be extended to future high density computer architectures.

Advantageously, liquid cooling of a multi-blade center system, or an electronics rack provides increased cooling at the module and rack level, and enables higher performance systems than currently feasible using air cooling. Further, a liquid cooling apparatus and any method thereof, as will be discussed later by implementation of various embodiments of the present invention, improves energy efficiency by eliminating or reducing requirements on one or more data center air-conditioning units. With a liquid cooling approach, especially an immersion cooling approach, conventional air-moving devices within the multi-blade center system and the electronic(s) rack are eliminated, thereby reducing acoustic noise within the data center. Additionally, a reduced form factor of the processor's thermal solution is provided, thus allowing more functionality to be packaged within a single system or blade. This added functionality could be memory, hard drives, or other devices, which would allow for a more competitive offering within the marketplace.

A number of liquid coolants can be used in connection with the present invention as will be discussed below. Some examples will be enumerated below with the understanding that this is not an exhaustive list and many other examples can be used as known to those skilled in the art. One example of a liquid coolant could be water. Other examples may comprise a fluorocarbon or segregated hydrofluoroether liquid such as FC-86, FC-87, FC-72, HFE-7000, HFE-7100, or HFE-7200 (each of which is available from 3M Corporation, St. Paul Minn.). Fluorocarbon liquid typically boils at 30° C.-80° C. at atmospheric pressure, while water boils at 100° C. Those skilled in the art should note, however, that the concepts disclosed herein, as stated earlier, are readily adapted to other types of coolant. For example, one or more of the coolants may comprise brine, liquid metal, or similar coolant or refrigerant, while still maintaining various advantages and unique features of the present invention.

Figure 4:
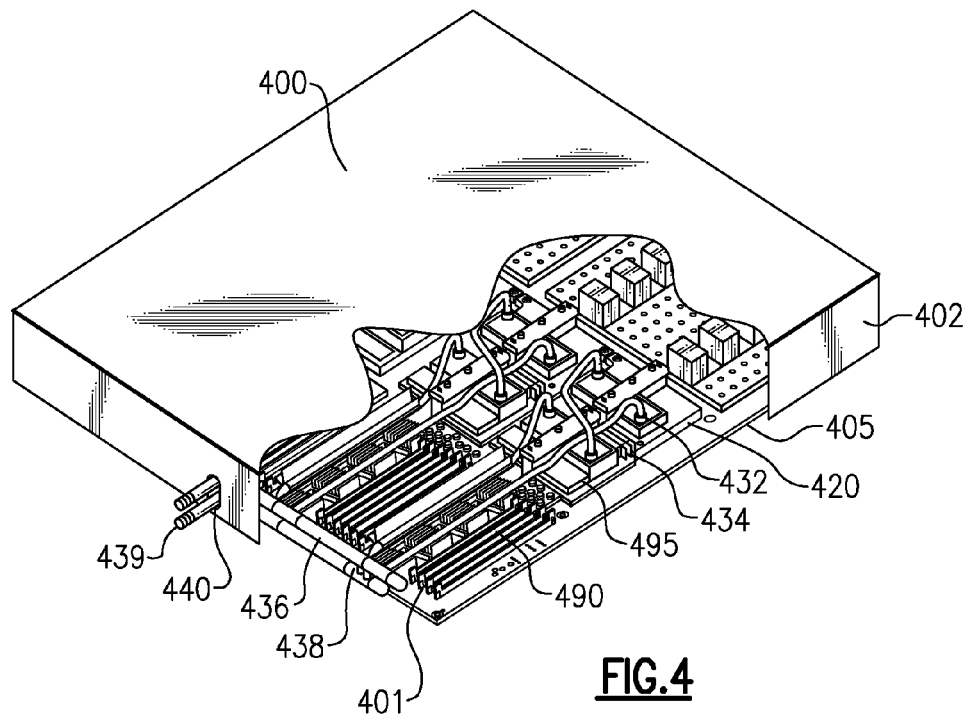
FIG. 4 is an isometric break-out view of one embodiment of the present invention.

FIG. 4 is an isometric break-out of one embodiment of the present invention. This embodiment shows a hybrid immersion cooled environment 400 with integral spot and bath cooling. The environment 400 can comprise a server, a blade, a node or any other arrangement simple or sophisticated which houses heat generating electronic components (as a whole referenced by numerals 401). In one embodiment of the present invention, the electronics components will be generally cooled using direct liquid cooling techniques (hereinafter immersion cooling). However, for important and sensitive components, such as modules and other key heat generating components, indirect liquid cooling is provided in one embodiment as shown in FIG. 4. These components can be selectively targeted and therefore the number and location of them can be application specific. The components cooled by indirect liquid cooling techniques will hereinafter be referenced as primary heat generating components for ease of reference and understanding.

Referring back to FIG. 4, the primary heat generating components are disposed on an electronics board 405. One or more cold plates 420 are provided such as to cool the primary heat generating components to which they are coupled. In one embodiment, the cold plate(s) 420 have extended surfaces, preferably comprising fins. The cold plate(s) will be cooled by means of a first coolant that circulates through the assembly 400 via one or more conduits or pipes. The coolant will be provided via a coolant supply that can in some embodiments be disposed externally.

The conduit can be a single unitary unit enabled to carry the coolant in unitary fabricated tubing or be comprised of a plurality of pieces of tubing that are sealably secured to one another in a variety of ways as known by those skilled in the art. By way of example, in FIG. 4, a plurality of conduit sections are identified and referenced by different numerals to ease understanding. These include a first coolant supply tube is shown and referenced by numerals 432, the first coolant bridge tube by numerals 434 a first coolant header by numerals 436 and first coolant return tube as 438. The first coolant in the closed conduit loop flows from a first coolant supply through inlets or ports provided external to the enclosure 402. The first coolant supply and return ports are referenced in the figure by numerals 439 collectively. This first coolant, once returned, can then be cooled and recirculated by a variety of ways as known to those skilled in the art.

Figure 5:
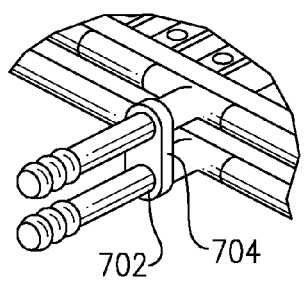
FIG. 5 is an illustration providing a detailed view of sealing structures as per embodiment of FIG. 4.

To provide indirect liquid cooling, the environment 400 is encapsulated in a liquid sealed enclosure 402 that contains the electronics board and all electronics components as shown. To ensure that the environment is kept liquid tight, the first coolant supply and return ports 439, in one embodiment, can be further sealed using an enclosure bulkhead seal or other means as known to those skilled in the art. The enclosure bulkhead seal in FIG. 4 is illustrated and referenced by numerals 440. A more detailed view of this sealed surface is shown in FIG. 5. In FIG. 5 a polymeric molded seal structure is shown for the conduit tubing and referenced by numerals 702. In addition, a sealing surface 704 is also provided.

In one embodiment, the conduit tubes supplying the first coolant to the cold plates may be selectively insulated from the second coolant to prevent preheating of the first coolant to ensure appropriate cooling to the primary heat generating components, while the first coolant as it exits the cold plate(s) remains at a temperature sufficiently low as to cool a secondary coolant (and indirectly the secondary heat generating components as will be discussed).

The enclosure 402 is at least partially, filled with a second coolant which provides cooling to the secondary components. The environment and the electronic components, cold plate's fins, and other extended surfaces projecting from the cold plate(s), and at least some of the tubing are submerged in this second coolant so as to maintain better cooling of the second coolant. The second coolant cools the secondary components through direct immersion, the first coolant cools the primary components through indirect liquid cold plate cooling, and the first coolant cools the second coolant via extended surfaces on the external surfaces of the tubing and cold plates.

Figure 7:
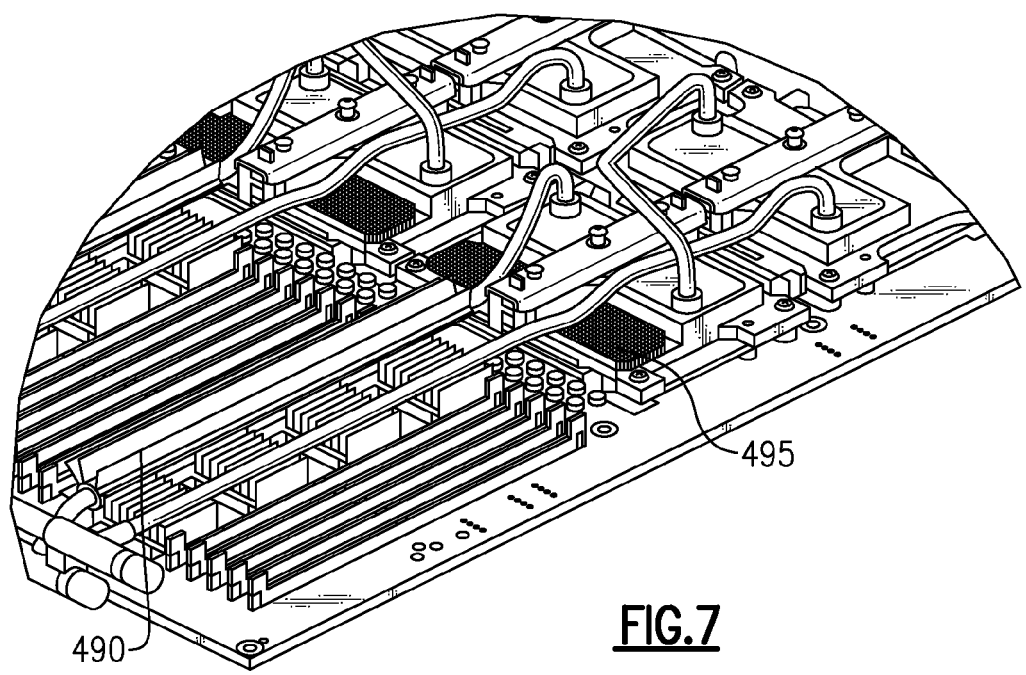
FIG. 7 is an illustration providing detailed view of the extended surface components as per embodiment of FIG. 4.

The first and second coolant can be comprised of the same or different liquids, such as water, refrigerants, dielectrics or oils. In one embodiment, the cold plate and coolant return tube both incorporate external extended surfaces, used to transfer heat from the second coolant to the first coolant. This is shown in the figure by reference numerals 495 (cold plate) and 490 (tubing). A more detailed view of cold plate and tubing extended external features are also provided in FIG. 7.

As with regards to direct cooling of the components, in one embodiment, the second coolant provides cooling to the electronics via free convection or a combination of free convection and boiling. In alternate embodiments, however, further cooling aid can be provided such as by implementing and including submerged pump(s) used to circulate the second coolant in the enclosure 402 (as will be further discussed in conjunction with FIG. 6).

Figure 8:
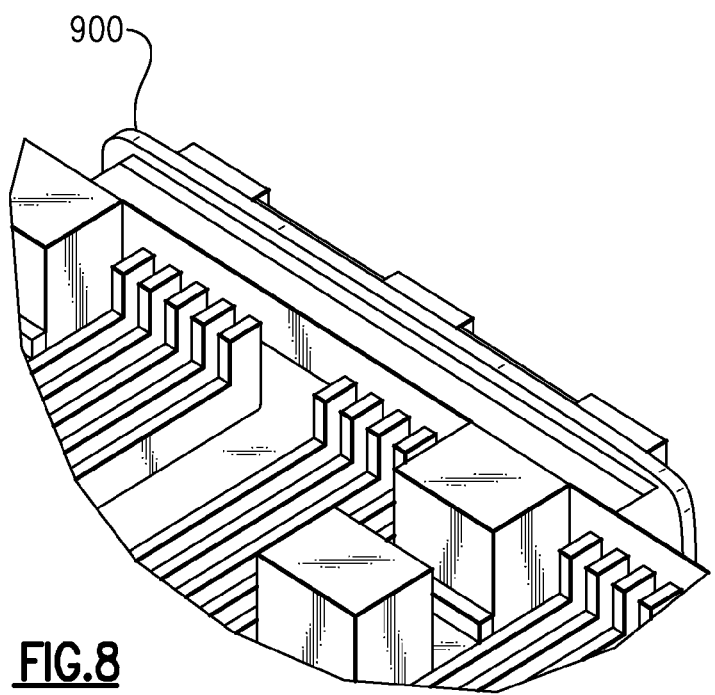
FIG. 8 is an illustration of polymeric molded sealing provided for electrical connectors as per embodiment of FIG. 4.

As discussed earlier, the enclosure 402 is liquid sealed. In one embodiment actual seals can be provided to prevent the escape of the second coolant. In another embodiment, any components which would breach the enclosure 402 are molded within polymeric features with rounded edges and can be configured to mate with any openings in the enclosure 402. These in turn will be sealed with gaskets, o-rings or other seals as known to those skilled in the art. FIG. 8 provides a detailed view of the polymeric molded sealing structure used for an electrical connection. The feature is referenced by numerals 900 in this figure.

Figure 6:
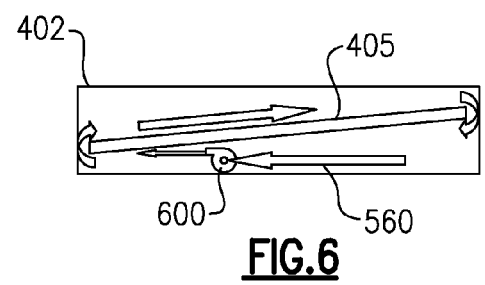
FIG. 6 provides a side view schematic of an alternate embodiment of the present invention.

FIG. 6 provides a side view schematic of an alternate embodiment of the present invention. In this embodiment, the electronics board 405 is mounted at an angle with respect to the horizontal. The nominal angle is preferably around 5-15 degrees. This tilting of the board is to facilitate the natural buoyancy driven flow, inherent in immersion cooling. It was earlier stated that in alternate embodiments a pump may be added to facilitate flow. FIG. 6 provides the incorporation of such a pump, referenced by numerals 600. The addition of the pump(s) 600 is to enhance the circulation, ensuring that the second coolant 560 is moving across the secondary heat generating components and the extended surfaces on the cold plates and tubes.

While the preferred embodiment of the invention has been described, it will be understood that those skilled in the art, both now and in the future, may make various improvements and enhancements which fall within the scope of the claims which follow. These claims should be construed to maintain the proper protection for the invention first described.

What is claimed is:

1. A hybrid immersion cooling apparatus for cooling electronic components housed in a computing environment comprising:
 a liquid tight enclosure having a plurality of primary heat generating electronic components and plurality of secondary heat generating electronic components;
 at least one cold plate having fins, said cold plate disposed such that it can cool said primary heat generating components;
 said cold plate being coupled to a first coolant conduit enabled to receive a first coolant;
 said coolant conduit fabricated to provide a closed loop for circulating said first coolant;
 said enclosure enabled by being liquid sealed to receive a second coolant such that when said second coolant can at least partially submerge said cold plate and conduit as well as said secondary and primary heat generating components inside said enclosure.

2. The apparatus of claim 1, wherein said first coolant conduit further comprises a first coolant supply tube and a first coolant return tube.

3. The apparatus of claim 2 wherein said first coolant return tube has external extended surfaces for transferring heat from said second coolant when supplied to said first coolant.

4. The apparatus of claim 3, wherein said cold plate comprises external extended surfaces such that heat is transferred from said second coolant to said first coolant.

5. The apparatus of claim 4, wherein supply tube(s) supplying said first coolant to said cold plates are insulated such as to prevent preheating of said first coolant.

6. The apparatus of claim 5, wherein said first coolant is supplied at a temperature such that when said first coolant exits said cold plate, the temperature is still sufficiently low as to cool said second coolant.

7. The apparatus of claim 6, wherein any components breaching said enclosure is molded within polymeric features.

8. The apparatus of claim 6, wherein any components breaching said enclosure are molded within polymeric features with rounded edges that are configured to mate with any openings in the enclosure.

9. The apparatus of claim 6, wherein said first coolant is supplied externally by connecting said first coolant conduit to a first coolant supply through supply and return ports.

10. The apparatus of claim 9, wherein said ports are sealed using an enclosure bulkhead seal.

11. The apparatus of claim 1, wherein said second coolant and first coolant are provided at selective temperatures such that said second coolant cools said electronic components via convection.

12. The apparatus of claim 1, wherein said second coolant is further circulated to achieve optimum cooling by disposing at least one circulating pump in said enclosure.

13. The apparatus of claim 1, wherein said first coolant is water and second coolant is a dielectric liquid.

14. The apparatus of claim 1, wherein said first and second coolants are made from same type of dielectric liquids.

15. The apparatus of claim 1, wherein said first and second coolants are provided at different temperatures.

16. The apparatus of claim 1, wherein said primary and secondary electronic components are disposed on an electronic board tilted at a nominal angle to aid circulation of second coolant.

17. The apparatus of claim 16, wherein said angle range between 5 and 15 degrees with respect to horizontal.

18. The apparatus of claim 17, wherein a submerged pump is disposed in said enclosure to also aid circulation of second coolant.

19. A hybrid immersion cooling apparatus for cooling electronic components housed in a computing environment comprising:

a liquid tight enclosure housing a plurality of primary heat generating electronic components and plurality of secondary heat generating electronic components; said primary heat generating components being cooled by indirect liquid cooling provided by at least one cold plate having fins and an extended external surface;

said cold plate being cooled by a first coolant supplied to said cold plate via a closed coolant conduit loop;

said conduit having a supply and return tube with said return tube having external extended surfaces;

said secondary electronic components being cooled by immersion liquid cooling via a second coolant supplied such that said second coolant at least partially submerges said cold plate and said primary and secondary electronic components so that cold plate and said first coolant return tube with extended surfaces can transfer heat from said second coolant to said first coolant.

20. A method of providing hybrid immersion cooling for electronic components housed in a computing environment comprising the steps: disposing a plurality of primary heat generating electronic components and a plurality of secondary heat generating electronic components in a liquid tight enclosure; providing indirect liquid cooling to said primary heat generating components though a cold plate having fins and extended external surfaces, said cold plate coupled to a first closed loop coolant conduit circulating a first coolant from a supply; providing direct liquid cooling to secondary electronic components by submerging them at least partially in said enclosure in a second coolant such that said first coolant conduit and said cold plate are also at least partially submerged and able to transfer heat from said second coolant to said first coolant.

* * * * *